(12) United States Patent
Udagawa

(10) Patent No.: US 6,737,659 B2
(45) Date of Patent: May 18, 2004

(54) DEVICES AND METHODS FOR MONITORING RESPECTIVE OPERATING TEMPERATURES OF COMPONENTS IN A MICROLITHOGRAPHY APPARATUS

(75) Inventor: Jin Udagawa, Ageo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/004,646

(22) Filed: Dec. 3, 2001

(65) Prior Publication Data

US 2002/0125447 A1 Sep. 12, 2002

(30) Foreign Application Priority Data

Dec. 1, 2000 (JP) .......................................... 2000-366847

(51) Int. Cl.[7] ............................................... H01J 37/304
(52) U.S. Cl. .................................................. 250/492.23
(58) Field of Search ........................... 250/492.1, 492.2, 250/492.21, 492.22, 492.3

(56) References Cited

U.S. PATENT DOCUMENTS 5,428,203 A * 6/1995 Kusunose ............... 219/121.25
5,834,785 A * 11/1998 Coon ......................... 250/492.2
6,238,830 B1 * 5/2001 Rangarajan et al. ............ 430/30

* cited by examiner

Primary Examiner—John R. Lee
Assistant Examiner—Christopher M. Kalivoda
(74) Attorney, Agent, or Firm—Klarquist Sparkman, LLP

(57) ABSTRACT

Devices and methods are disclosed for monitoring temperature of certain components (e.g., lenses, deflectors, and stages) in real time during operation of a microlithography apparatus, especially a charged-particle-beam microlithography apparatus. The components have associated therewith respective temperature sensors that provide temperature data to a temperature-monitoring device. The temperature-monitoring device interprets the data and routes corresponding signals to a controller that commands certain responsive action by any of various components of the apparatus serving to control the temperatures within respective specified tolerances. If a sudden temperature change occurs in a monitored component of the apparatus, then a warning device activates an alarm, and the controller commands corrective actions to return the culprit temperature to within the specified gradient. Depending upon the magnitude of the detected temperature deviation, the controller can initiate a calibration routine of the microlithography apparatus.

20 Claims, 3 Drawing Sheets

DEVICES AND METHODS FOR MONITORING RESPECTIVE OPERATING TEMPERATURES OF COMPONENTS IN A MICROLITHOGRAPHY APPARATUS

FIELD

This disclosure pertains to microlithography (transfer of a pattern to a sensitive substrate), especially as performed using a charged particle beam. Microlithography is a key technology used in the fabrication of microelectronic devices such as integrated circuits, displays, and micromachines. More specifically, the disclosure pertains to monitoring the respective temperature of various components of a microlithography apparatus (e.g., lenses, deflectors, and stages), and taking corrective action when a temperature anomaly is detected.

BACKGROUND

In recent years, the resolution limitations of optical microlithography (specifically, microlithography performed using a beam of ultraviolet light) have become increasingly apparent. Hence, substantial development effort currently is being expended to develop a practical "next-generation" microlithography technology. A principal candidate next-generation microlithography technology is so-called high-throughput, reduced-projection charged-particle-beam (CPB) microlithography. CPB microlithography offers prospects of much finer resolution than optical microlithography for reasons similar to the reasons for which electron microscopy yields better imaging resolution than optical microscopy. In fact, CPB microlithography apparatus currently under development have exhibited an ability to resolve substantially smaller linewidths and feature sizes than obtainable using optical microlithography.

CPB microlithography apparatus (employing, as a charged particle beam, an electron beam or ion beam) comprise CPB lenses, deflectors, and stigmators that include electromagnetic coils and the like. It has been found that the operating characteristics of an electromagnetic coil change if the coil experiences a temperature change (e.g., heat generated by passage of electrical current through the coil or heat conducted to the coil from an extraneous source). Such changes in the operating characteristics adversely affect the imaging characteristics and image-position control aspects of the CPB optical system of which the affected lens or coil is a part. As the demands of achieving ever-finer pattern resolution become more pressing, the need to provide temperature control of these components becomes an increasingly serious problem in CPB microlithography apparatus.

Various temperature-control devices and mechanisms are known. However, conventional devices and mechanisms have limited responsiveness and controllability that simply are inadequate for the demands of modern CPB microlithography. Consequently, using conventional temperature-control devices, it has been impossible from a practical standpoint to achieve the requisite constantly controlled temperatures with high accuracy and precision. It also has been impossible to eliminate component deformation due to temperature fluctuations.

SUMMARY

In view of the shortcomings of conventional technology summarized above, the invention provides, inter alia, CPB microlithography apparatus and methods that are more thermally stable and hence achieve more accurate and stable exposures.

To such end, a first aspect of the invention is directed, in the context of microlithography apparatus for transferring a pattern onto a sensitive substrate using a charged particle beam, temperature-control devices. An embodiment of a temperature-control device is associated with components of a CPB optical system as used for imaging the pattern at specified locations on the substrate. The embodiment includes a respective temperature sensor associated with at least one component of the CPB optical system. The embodiment also includes a temperature-monitoring device to which the at least one temperature sensor is connected. The temperature-monitoring device is configured to receive the respective temperature-detection signals from the at least one temperature sensor, to ascertain whether the temperature-detection signals indicate existence of a temperature anomaly, and to produce respective temperature-control commands. The device also includes a controller to which the temperature-monitoring device is connected. The controller is configured to receive the temperature-control commands from the temperature-monitoring device and, if the temperature-control commands indicate existence of the temperature anomaly, to initiate at least one action selected from triggering an alarm, stopping exposure, and calibration of the microlithography system. With such a device, changes in temperature of respective component(s) are detected and monitored, wherein the CPB microlithography apparatus is controlled according to the respective magnitudes of the changes. In any event, temperature changes of the component(s) are more rapidly dealt with than conventionally, allowing a more stable exposure to be achieved.

The CPB optical system typically comprises a CPB source, at least one condenser lens, at least one projection lens, at least one deflector, and at least one stage. In such a configuration, a respective temperature sensor desirably is associated with each of the CPB source, the at least one condenser lens, the at least one projection lens, the at least one deflector, and the at least one stage.

The temperature-control device can further comprise a display connected to the temperature-monitoring device and configured to display temperature data as obtained by the at least one temperature sensor and interpreted by the temperature-monitoring device.

The temperature-control device can further comprise a warning device connected to the temperature-monitoring device and configured to activate an alarm if a temperature detected by a temperature sensor exceeds a respective specification, thereby indicating existence of the temperature anomaly.

The temperature-monitoring device can be configured to ascertain whether the temperature-detection signals indicate a temperature anomaly in which a temperature as sensed by a temperature sensor has exceeded a specified value or has exceeded a specified "gradient" (i.e., rate of change, especially from lower to higher temperature). The specified value or gradient varies with different CPB optical systems and/or different CPB microlithography systems. By way of example, the temperature-monitoring device can be configured to trigger the alarm whenever a detected temperature gradient is at least 0.04° C./s, to trigger a calibration of the CPB microlithography apparatus whenever a detected temperature gradient is at least 0.08° C./s, and to trigger a halt of exposure whenever a detected temperature gradient is at least 0.1° C./s.

According to another aspect of the invention, microlithography methods are provided for transferring a pattern onto a sensitive substrate using a charged particle beam passing through a CPB optical system. According to an embodiment of such a method, respective temperatures of components of the CPB optical system are detected. The respective detected temperatures of the components are continuously monitored so as to produce temperature-monitoring data. The temperature-monitoring data are processed, including comparing the data to respective specified temperature data for the respective components to determine whether the temperature-monitoring data indicate existence of a respective temperature anomaly. If a temperature anomaly is indicated, then at least one action is triggered, selected from triggering an alarm, stopping exposure, and calibration of the microlithography system.

This method embodiment can further include the step of displaying the temperature-monitoring data, which desirably are displayed in real time. Thus, an operator can easily check the temperature status of the microlithography system and rapidly respond to sudden temperature changes, for example, of any of the monitored components.

The CPB optical system can comprise a CPB source, at least one condenser lens, at least one projection lens, at least one deflector, and at least one stage. In this context, the detecting step can comprise detecting a respective temperature of each of the CPB source, the at least one condenser lens, the at least one projection lens, the at least one deflector, and the at least one stage.

The monitoring step can include ascertaining whether a detected temperature has exceeded a specified value or has exceeded a specified gradient indicative of the temperature anomaly. For example, the action-initiating step can comprise: triggering an alarm whenever a detected temperature gradient is at least 0.04° C./s, triggering a system calibration whenever a detected temperature gradient is at least 0.08° C./s, and triggering a halt of exposure whenever a detected temperature gradient is at least 0.1° C./s.

The foregoing and additional features and advantages of the invention will be more readily apparent from the following detailed description, which proceeds with reference to the accompanying drawings.

DETAILED DESCRIPTION

This invention is described below in connection with representative embodiments that are not intended to be limiting in any way.

Figure 2:
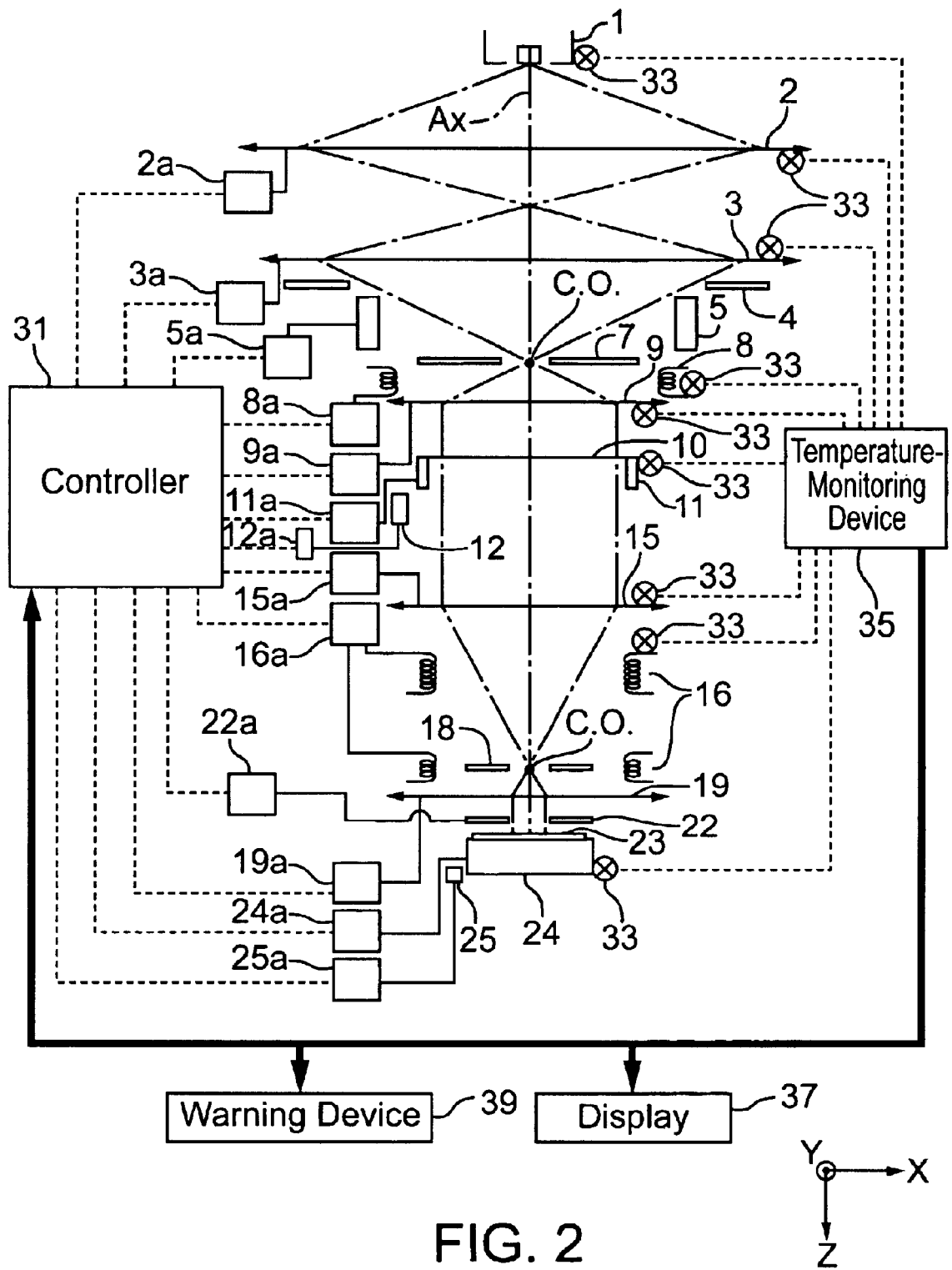
FIG. 2 is an elevational schematic diagram of imaging relationships and control systems of a representative embodiment of a CPB microlithography apparatus that includes a temperature monitoring and control device.

FIG. 2 is a schematic elevational diagram of a charged-particle-beam (CPB) divided-reticle projection microlithography system incorporating certain aspects of the invention. The system of FIG. 2 is described in the context of using an electron beam as an exemplary charged-particle lithographic energy beam. It will be understood that the principles of the system shown in FIG. 2 can be applied with equal facility to use with another type of charged particle beam such as an ion beam. FIG. 2 also depicts general imaging and control relationships of the subject system.

Situated at the extreme upstream end of the system is an electron gun 1 that emits an electron beam propagating in a downstream direction generally along an optical axis Ax. Downstream of the electron gun 1 are a first condenser lens 2 and a second condenser lens 3 collectively constituting a two-stage condenser-lens assembly. The condenser lenses 2, 3 converge the electron beam at a crossover C.O. situated on the optical axis Ax at a blanking diaphragm 7.

Downstream of the second condenser lens 3 is a "beam-shaping diaphragm" 4 comprising a plate defining an axial aperture (typically rectangular in profile) that trims and shapes the electron beam passing through the aperture. The aperture is sized and configured to trim the electron beam sufficiently to illuminate one exposure unit (subfield) on the reticle 10. An image of the beam-shaping diaphragm 4 is formed on the reticle 10 by an illumination lens 9.

The electron-optical components situated between the electron gun 1 and the reticle 10 collectively constitute an "illumination-optical system" of the depicted microlithography system. The electron beam propagating through the illumination-optical system is termed an "illumination beam" because it illuminates a desired region of the reticle 10. As the illumination beam propagates through the illumination-optical system, the beam actually travels in a downstream direction through an axially aligned "beam tube" (not shown but well understood in the art) that can be evacuated to a desired vacuum level.

A blanking deflector 5 is situated downstream of the beam-shaping aperture 4. The blanking deflector 5 laterally deflects the illumination beam as required to cause the illumination beam to strike the aperture plate of the blanking diaphragm 7, thereby preventing the illumination beam from being incident on the reticle 10.

A subfield-selection deflector 8 is situated downstream of the blanking diaphragm 7. The subfield-selection deflector 8 laterally deflects the illumination beam as required to illuminate a desired reticle subfield situated within the optical field of the illumination optical system. Thus, subfields of the reticle 10 are sequentially scanned by the illumination beam in a horizontal direction (X direction in the figure). The illumination lens 9 is situated downstream of the subfield-selection deflector 8.

The reticle 10 typically defines many subfields (e.g., tens of thousands of subfields). The subfields collectively define the pattern for a layer to be formed at a single die ("chip") on a lithographic substrate. The reticle 10 is mounted on a movable reticle stage 11. Using the reticle stage 11, by moving the reticle 10 in a direction (Y and/or X direction) perpendicular to the optical axis Ax, it is possible to illuminate the respective subfields on the reticle 10 extending over a range that is wider than the optical field of the illumination-optical system. The position of the reticle stage 11 in the XY plane is determined using a "position detector" 12 typically configured as a laser interferometer. A laser interferometer is capable of measuring the position of the reticle stage 11 with extremely high accuracy in real time.

Situated downstream of the reticle 10 are first and second projection lenses 15, 19, respectively, and an imaging-position deflector 16. The illumination beam, by passage through an illuminated subfield of the reticle 10, becomes a "patterned beam" because the beam has acquired an aerial image of the illuminated subfield. The patterned beam is imaged at a specified location on a substrate 23 (e.g., "wafer") by the projection lenses 15, 19 collectively functioning as a "projection-lens assembly." To ensure imaging at the proper location, the imaging-position deflector 16 imparts the required lateral deflection of the patterned beam, as described later below with reference to FIG. 2.

So as to be imprintable with the image carried by the patterned beam, the upstream-facing surface of the substrate 23 is coated with a suitable "resist" that is imprintably sensitive to exposure by the patterned beam. When forming the image on the substrate, the projection-lens assembly "reduces" (demagnifies) the aerial image. Thus, the image as formed on the substrate 23 is smaller (usually by a defined integer-ratio factor termed the "demagnification factor") than the corresponding region illuminated on the reticle 10. By thus causing imprinting on the surface of the substrate 23, the apparatus of FIG. 2 achieves "transfer" of the pattern image from the reticle 10 to the substrate 23.

The components of the depicted electron-optical system situated between the reticle 10 and the substrate 23 are collectively termed the "projection-optical system." The substrate 23 is situated on a substrate stage 24 situated downstream of the projection-optical system. As the patterned beam propagates through the projection-optical system, the beam actually travels in a downstream direction through an axially aligned "beam tube" (not shown but well understood in the art) that can be evacuated to a desired vacuum level.

The projection-optical system forms a crossover C.O. of the patterned beam on the optical axis Ax at the rear focal plane of the first projection lens 15. The position of the crossover C.O. on the optical axis Ax is a point at which the axial distance between the reticle 10 and substrate 23 is divided according to the demagnification ratio. Situated between the crossover C.O. (i.e., the rear focal plane) and the reticle 10 is a contrast-aperture diaphragm 18. The contrast-aperture diaphragm 18 comprises an aperture plate that defines an aperture centered on the axis Ax. With the contrast-aperture diaphragm 18, electrons of the patterned beam that were scattered during transmission through the reticle 10 are blocked so as not to reach the substrate 23.

A backscattered-electron (BSE) detector 22 is situated immediately upstream of the substrate 23. The BSE detector 22 is configured to detect and quantify electrons backscattered from certain marks situated on the upstream-facing surface of the substrate 23 or on an upstream-facing surface of the substrate stage 24. For example, a mark on the substrate 23 can be scanned by a beam that has passed through a corresponding mark pattern on the reticle 10. By detecting backscattered electrons from the mark at the substrate, it is possible to determine the relative positional relationship of the reticle 10 and the substrate 23.

The substrate 23 is mounted to the substrate stage 24 via a wafer chuck (not shown but well understood in the art), which presents the upstream-facing surface of the substrate 23 in an XY plane. The substrate stage 24 (with chuck and substrate 23) is movable in the X and Y directions. Thus, by simultaneously scanning the reticle stage 11 and the substrate stage 24 in mutually opposite directions, it is possible to transfer each subfield within the optical field of the illumination-optical system as well as each subfield outside the optical field to corresponding regions on the substrate 23. The substrate stage 24 also includes a "position detector" 25 configured similarly to the position detector 12 of the reticle stage 11.

Each of the lenses 2, 3, 9, 15, 19 and deflectors 5, 8, 16 is controlled by a controller 31 via a respective coil-power controller 2a, 3a, 9a, 15a, 19a and 5a, 8a, 16a. Similarly, the reticle stage 11 and substrate stage 24 are controlled by the controller 31 via respective stage drivers 11a, 24a. The position detectors 12, 25 produce and route respective stage-position signals to the controller 31 via respective interfaces 12a, 25a each including amplifiers, analog-to-digital (A/D) converters, and other circuitry for achieving such ends. In addition, the BSE detector 22 produces and routes signals to the controller 31 via a respective interface 22a.

From the respective data routed to the controller 31, as a subfield is being transferred the controller 31 ascertains, inter alia, any control errors of the respective stage positions. To correct such control errors, the imaging-position deflector 16 is energized appropriately to deflect the patterned beam. Thus, a reduced image of the illuminated subfield on the reticle 10 is transferred accurately to the desired target position on the substrate 23. This real-time correction is made as each respective subfield image is transferred to the substrate 23, and the subfield images are positioned such that they are properly stitched together on the substrate 23.

The apparatus shown in FIG. 2 also comprises respective temperature sensors 33 (e.g., platinum resistors or the like) associated with the electron gun 1, the condenser lenses 2, 3, the projection lenses 15, 19, the deflectors 5, 16, and the stages 11, 24. The temperature sensors can be mounted in any of various respective manners and locations on the respective components, depending upon the component with which the particular temperature sensor is associated. For example, on any of the lenses 2, 3, 15, 19, the respective temperature sensor 33 can be mounted, e.g., directly on the electromagnetic coil that comprises the respective lens, or on the respective yoke of the lens. In the case of the electron gun 1, the temperature sensor 33 can be the same temperature sensor conventionally used to detect the temperature of the heater.

The temperature sensors 33 are connected to a temperature-monitoring device 35 that constantly monitors and measures the temperatures of the various components with which the temperature sensors 33 are associated. Respective temperature tolerances and gradients for the various components can be set in the temperature-monitoring device 35, wherein "tolerance" in this context is a respective range of acceptable operating temperatures for the respective component with which a temperature sensor 33 is associated, and "gradient" in this context is a respective acceptable rate of change of operating temperature for the respective component. Connected to the temperature-monitoring device 35 is a display 37 configured to display the measured-temperature data in real time. Using the display 37, an operator of the apparatus can easily check the temperature of any of the various monitored components. Exemplary methods of displaying the temperature data include a numeric display of the temperatures or a graphic display showing past measurements, current measurements, and respective target values.

The temperature-monitoring device 35 also is connected to a warning device 39 and the controller 31. If, for example, an excessive change in operating temperature is sensed by a particular sensor 33 (and interpreted as such by the temperature-monitoring device 35), then the warning device 39 activates an audio or visual alarm. In the event of an alarm condition, a respective temperature-control signal is routed from the temperature-monitoring device 35 to the controller 31. In response, the controller 31 mediates a corrective response so as to cause a return of the culprit temperature to within the specified gradient.

Figure 1:
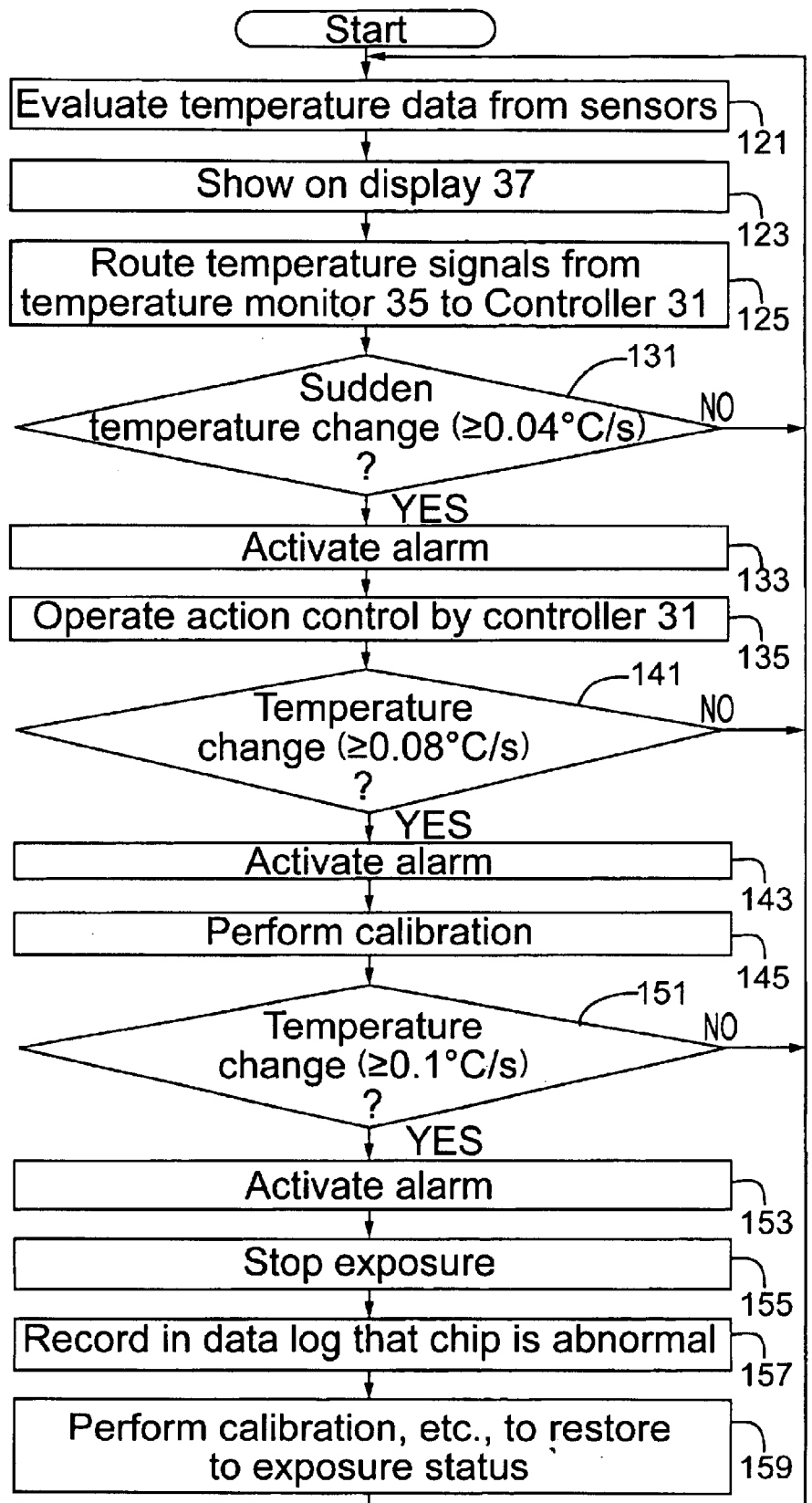
FIG. 1 is a flow chart of steps of a representative embodiment of a temperature-monitoring and control method according to an aspect of the invention.

A representative exposure method associated with temperature control is shown in FIG. 1. In the depicted flowchart, a first step 121 involves evaluation by the temperature-monitoring device 35 of the temperature data supplied by the respective sensors 33 mounted throughout the microlithography apparatus as discussed above. The temperature signals are routed as required from the temperature-monitoring device 35 to the controller 31 (step 125) and to the display 37 (step 123). The display 37, under control of the controller 31, displays the temperature data. The controller 31 also triggers responses as required to keep the various temperatures within specified tolerances.

Normally, microlithographic exposure is performed while repeating steps 121, 123, 125 and maintaining the respective temperatures substantially constant. The respective temperature tolerances for the various monitored components likely will differ from each other depending upon the respective type and location of the component. By way of example, the projection lenses 15, 19 generally are maintained within the range of approximately 23±0.1° C.

In order to maintain such an operating temperature range of the projection lenses, it is important that respective temperature-control subsystems of the projection lenses be capable of responding rapidly to changes in operating temperature and also be capable of keeping up with the rate of temperature change. Typically, there are limits to the ability of such subsystems to respond in such a manner. Hence, it is important that an operator of the CPB microlithography apparatus be alerted if temperature conditions exist that are beyond the capability of the temperature-control subsystems to accommodate. If an excessive temperature change (e.g., an increase of at least 0.04° C./s) occurs at any monitored location in the microlithography apparatus (step 131), then an alarm is activated by the warning device 39 (step 133) to alert the operator of the temperature anomaly. By triggering an alarm at the onset of what may superficially appear to be a small rate of temperature increase, the operator is alerted very quickly of a temperature condition that, if left uncorrected, could cause a substantial decrease in exposure accuracy. In response to the alarm, the operator takes corrective action to rectify the situation. Alternatively or in addition, the controller 31 (having received the temperature signal from the temperature-monitoring device 35) triggers one or more appropriate machine actions that correct the situation and thus return the culprit temperature to with the specified gradient (step 135). Examples of corrective machine actions are changes of beam position, changes in focus, changes in magnification, etc.

Returning to step 121, the temperature data are monitored and checked for anomalies as discussed above. Upon correction of a temperature anomaly that initiated the alarm, the alarm ceases and the process returns to the normal loop of steps 121 and 123. Microlithographic exposure is resumed while maintaining constancy of the various monitored temperatures.

If the temperature anomaly is not corrected by actions initiated in step 135 (e.g., if the detected temperature change increases to 0.08° C./s or greater (step 141)), then a different alarm from the alarm activated in step 133 is activated by the warning device 39 (step 143). In response, the controller 31 initiates one or more routines that perform calibration of the microlithography apparatus according to the temperature signals actually being received from the temperature-monitoring device 35 (step 145). During calibration a charged particle beam is passed through a mark pattern on the reticle 10 such that the beam downstream of the mark pattern scans corresponding marks on the substrate 23. Excessive positional shifts of the reticle 10 and substrate 23 relative to each other caused by the temperature anomaly, compared to normal operating conditions, are detected and corrected as required. For example, changes in focus or demagnification ratio, for example, caused by the temperature anomaly are corrected. Alternatively or in addition, the sensitivity of one or more lenses and/or deflectors in the CPB optical system is adjusted. As a result of this corrective action, the respective monitored components are controllably manipulated to perform within specified tolerances despite the temperature change. If the temperature anomaly is corrected, then the alarm is terminated, the process returns to the normal loop of steps 121 and 123, and microlithographic exposure is performed while maintaining the various temperatures within their specified tolerances.

It will be understood that the specific gradients of 0.04° C./s and 0.08° C./s noted above are exemplary only, based on general experience with CPB microlithography systems and currently desired levels of exposure accuracy. Other gradients may be used, depending upon the particular CPB microlithography system in use, the particular temperature-control subsystems included with the CPB microlithography system, the required exposure accuracy, and other factors.

If the temperature anomaly is not corrected by the actions in step 145 (e.g., if the detected temperature change increases to 0.1° C./s or greater (step 151)), then a different alarm from the alarm triggered in step 143 is activated by the warning device 39 (step 153). In this instance, the temperature-monitoring device 35 sends a signal to the controller 31 that causes an interruption of exposure (step 155). Typically, during the interruption, the stages 11, 24 are stopped and the illumination beam is blanked. Also, a recordation in the data log of the microlithography system is triggered, stating that the chip being exposed at the time is abnormal (step 157). In response, calibrations and the like are performed to restore operating conditions to within respective specifications so that microlithographic exposure can be resumed (step 159). If the anomaly is corrected, then the alarm ceases, the process returns to the normal loop of steps 121 and 123, and exposure of the next chip or wafer is performed while maintaining the various temperatures within respective specified tolerances.

Figure 3:
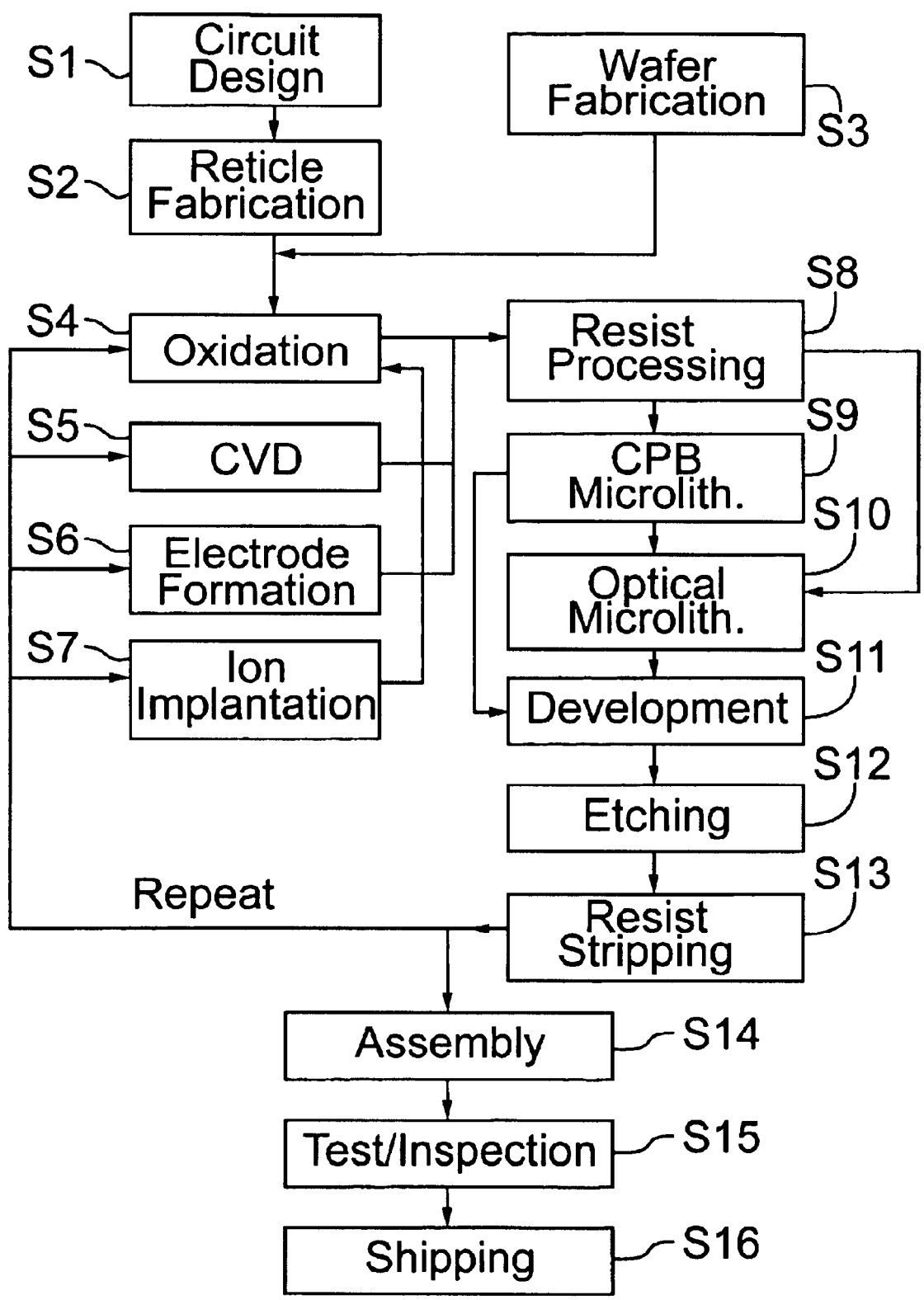
FIG. 3 is a flowchart of steps in a process for manufacturing a microelectronic device such as a semiconductor chip (e.g., integrated circuit or LSI), liquid-crystal panel, CCD, thin-film magnetic head, or micromachine, the process including performing microlithography using a microlithography apparatus according to the invention.

FIG. 3 is a flow chart of steps in a process for manufacturing a microelectronic device such as a semiconductor chip (e.g., an integrated circuit or LSI device), a display panel (e.g., liquid-crystal panel), charged-coupled device (CCD), thin-film magnetic head, micromachine, for example. In step S1, the circuit for the device is designed. In step S2 a reticle ("mask") for the circuit is manufactured. In step S2, local resizing of pattern elements can be performed to correct for proximity effects or space-charge effects during exposure. In step S3, a wafer is manufactured from a material such as silicon.

Steps S4–S13 are directed to wafer-processing steps, in which the circuit pattern defined on the reticle is transferred onto the wafer by microlithography. Step S14 is an assembly step (also termed a "post-process" step) in which the wafer that has been passed through steps S4–S13 is formed into semiconductor chips. This step can include, e.g., assembling the devices (dicing and bonding) and packaging (encapsulation of individual chips). Step S15 is an inspection step in which any of various operability and qualification tests of the device produced in step S14 are conducted. Afterward, devices that successfully pass step S15 are finished, packaged, and shipped (step S16).

Steps S4–S13 also provide representative details of wafer processing. Step S4 is an oxidation step for oxidizing the surface of a wafer. Step S5 involves chemical vapor deposition (CVD)) for forming an insulating film on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. Step S9 involves microlithographically exposing the resist using a charged particle beam to as to imprint the resist with the reticle pattern of the reticle produced in step S2. In step S9, a CPB microlithography apparatus as described above can be used. Step S10 involves microlithographically exposing the resist using optical microlithography. This step also can be performed using a reticle produced in step S2. Step S11 involves developing the exposed resist on the wafer. Step S12 involves etching the wafer to remove material from areas where developed resist is absent. Step S13 involves resist separation, in which remaining resist on the wafer is removed after the etching step. By repeating steps S4–S13 as required, circuit patterns as defined by successive reticles are formed superposedly on the wafer.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a microlithography apparatus for transferring a pattern onto a sensitive substrate using a charged particle beam, the apparatus including components of a charged-particle-beam (CPB) optical system as used for imaging the pattern at specified locations on the substrate, a temperature-control device, comprising:

a respective temperature sensor associated with at least one component of the CPB optical system;

a temperature-monitoring device to which the at least one temperature sensor is connected, the temperature-monitoring device being configured to receive the respective temperature-detection signals from the at least one temperature sensor, to ascertain whether the temperature-detection signals indicate existence of a temperature anomaly, and to produce respective temperature-control commands; and a controller to which the temperature-monitoring device is connected, the controller being configured to receive the temperature-control commands from the temperature-monitoring device and, if the temperature-control commands indicate existence of the temperature anomaly, to initiate at least one action selected from triggering an alarm, stopping exposure, and calibration of the microlithography system.

2. The temperature-control device of claim 1, wherein:
   the CPB optical system comprises a CPB source, at least one condenser lens, at least one projection lens, at least one deflector, and at least one stage; and
   a respective temperature sensor is associated with each of the CPB source, the at least one condenser lens, the at least one projection lens, the at least one deflector, and the at least one stage.

3. The temperature-control device of claim 1, further comprising a display connected to the temperature-monitoring device and configured to display temperature data as obtained by the at least one temperature sensor and interpreted by the temperature-monitoring device.

4. The temperature-control device of claim 1, further comprising a warning device connected to the temperature-monitoring device and configured to activate an alarm if a temperature detected by a temperature sensor exceeds a respective specification, thereby indicating existence of the temperature anomaly.

5. The temperature-control device of claim 1, wherein the temperature-monitoring device is configured to ascertain whether the temperature-detection signals indicate a temperature anomaly in which a temperature as sensed by a temperature sensor has exceeded a specified value.

6. The temperature-control device of claim 1, wherein the temperature-monitoring device is configured to ascertain whether the temperature-detection signals indicate a temperature anomaly in which a temperature as sensed by a temperature sensor has exceeded a specified gradient.

7. The temperature-control device of claim 6, wherein the temperature-monitoring device is configured to trigger the alarm whenever a detected temperature gradient is at least 0.04° C./s, to trigger a calibration of the CPB microlithography apparatus whenever a detected temperature gradient is at least 0.08° C./s, and to trigger a halt of exposure whenever a detected temperature gradient is at least 0.1° C./s.

8. A microlithography method for transferring a pattern onto a sensitive substrate using a charged particle beam passing through a charged-particle-beam (CPB) optical system, the method comprising:

detecting respective temperatures of components of the CPB optical system;

continuously monitoring the respective detected temperatures of the components so as to produce temperature-monitoring data;

processing the temperature-monitoring data, including comparing the data to respective specified temperature data for the respective components to determine whether the temperature-monitoring data indicate existence of a respective temperature anomaly; and if a temperature anomaly is indicated, then initiating at least one action selected from triggering an alarm, stopping exposure, and calibration of the microlithography system.

9. The method of claim 8, further comprising the step of displaying the temperature-monitoring data.

10. The method of claim 9, wherein the temperature-monitoring data are displayed in real time.

11. The method of claim 8, wherein:
    the CPB optical system comprises a CPB source, at least one condenser lens, at least one projection lens, at least one deflector, and at least one stage; and
    the detecting step comprises detecting a respective temperature of each of the CPB source, the at least one condenser lens, the at least one projection lens, the at least one deflector, and the at least one stage.

12. The method of claim 8, wherein the monitoring step comprises ascertaining whether a detected temperature has exceeded a specified value indicative of the temperature anomaly.

13. The method of claim 8, wherein the monitoring step comprises ascertaining whether a detected temperature has exceeded a specified gradient indicative of the temperature anomaly.

14. The method of claim 13, wherein the action-initiating step comprises:

triggering an alarm whenever a detected temperature gradient is at least 0.04° C./s;

triggering a system calibration whenever a detected temperature gradient is at least 0.08° C./s; and triggering a halt of exposure whenever a detected temperature gradient is at least 0.1° C./s.

15. A microlithography apparatus, comprising:

a charged-particle-beam (CPB) optical system situated and configured to transfer a pattern onto a sensitive substrate using a charged particle beam, the CPB optical system comprising multiple CPB-optical components as used for imaging the pattern at specified locations on the substrate; and a temperature-control device, comprising (i) a respective temperature sensor associated with at least one component of the CPB optical system; (ii) a temperature-monitoring device to which the at least one temperature sensor is connected, the temperature-monitoring device being configured to receive the respective temperature-detection signals from the at least one temperature sensor, to ascertain whether the temperature-detection signals indicate existence of a temperature anomaly, and to produce respective temperature-control commands; and (iii) a controller to which the temperature-monitoring device is connected, the controller being configured to receive the temperature-control commands from the temperature-monitoring device and, if the temperature-control commands indicate existence of the temperature anomaly, to initiate at least one action selected from triggering an alarm, stopping exposure, and calibration of the microlithography system.

16. A charged-particle-beam microlithography apparatus, comprising:

an illumination-optical system comprising multiple components subject to performance change upon experiencing respective changes in operating temperature;

a projection-optical system situated downstream of the illumination-optical system and comprising multiple components subject to performance change upon experiencing respective changes in operating temperature; and a temperature-control device, including a respective temperature sensor associated with each of said components of the illumination-optical system and projection-optical system, a temperature-monitoring device, and a controller, wherein the temperature-monitoring device is connected to the temperature sensors and is configured to receive the respective temperature-detection signals from the temperature sensor, to ascertain whether the temperature-detection signals indicate existence of a temperature anomaly, and to produce respective temperature-control commands, and wherein the controller is connected to the temperature-monitoring device and is configured to receive the temperature-control commands from the temperature-monitoring device and, if the temperature-control commands indicate existence of the temperature anomaly, to initiate at least one action selected from triggering an alarm, stopping exposure, and calibration of the microlithography system.

17. The charged-particle-beam microlithography apparatus of claim 16, wherein the temperature-monitoring device is configured to ascertain whether the temperature-detection signals indicate a temperature anomaly in which a temperature as sensed by a temperature sensor has exceeded a specified value.

18. The charged-particle-beam microlithography apparatus of claim 16, wherein the temperature-monitoring device is configured to ascertain whether the temperature-detection signals indicate a temperature anomaly in which a temperature as sensed by a temperature sensor has exceeded a specified gradient.

19. A method for fabricating a microelectronic device, comprising performing a microlithography method as recited in claim 8.

20. A method for fabricating a microelectronic device, comprising performing a microlithography method using a CPB microlithography apparatus including (a) an illumination-optical system comprising multiple components subject to performance change upon experiencing respective changes in operating temperature; (b) a projection-optical system situated downstream of the illumination-optical system and comprising multiple components subject to performance change upon experiencing respective changes in operating temperature; and (c) a temperature-control device, including (i) a respective temperature sensor associated with each of said components of the illumination-optical system and projection-optical system, (ii) a temperature-monitoring device, and (iii) a controller, wherein the temperature-monitoring device is connected to the temperature sensors and is configured to receive the respective temperature-detection signals from the temperature sensor, to ascertain whether the temperature-detection signals indicate existence of a temperature anomaly, and to produce respective temperature-control commands, and wherein the controller is connected to the temperature-monitoring device and is configured to receive the temperature-control commands from the temperature-monitoring device and, if the temperature-control commands indicate existence of the temperature anomaly, to initiate at least one action selected from triggering an alarm, stopping exposure, and calibration of the microlithography system.

* * * * *

UNITED STATES PATENT AND TRADEMARK OFFICE
CERTIFICATE OF CORRECTION

PATENT NO. : 6,737,659 B2
DATED : May 18, 2004
INVENTOR(S) : Udagawa

It is certified that error appears in the above-identified patent and that said Letters Patent is hereby corrected as shown below:

Column 2,
Line 36, "CPB source," should be -- CPB sources, --.

Column 9,
Line 4, "(CVD))" should be -- (CVD) --.
Line 11, "to as to" should be -- so as to --.

Signed and Sealed this

Nineteenth Day of April, 2005

JON W. DUDAS
*Director of the United States Patent and Trademark Office*